United States Patent [19]

Gauder

[11] Patent Number: 4,761,747
[45] Date of Patent: Aug. 2, 1988

[54] SWITCHING NETWORK FOR MONITORING STATIONS

[75] Inventor: Michael J. Gauder, Englewood, Ohio

[73] Assignee: The United States of America as represented by the Secretary of the Air Force, Washington, D.C.

[21] Appl. No.: 877,926

[22] Filed: Jun. 24, 1986

[51] Int. Cl.⁴ .................. G06K 15/00; H01H 67/00
[52] U.S. Cl. .................. 364/514; 364/481; 379/29; 340/825.04
[58] Field of Search .................. 364/514, 481; 340/825.03, 825.04, 825.79; 379/29

[56] References Cited

U.S. PATENT DOCUMENTS

| | | | |
|---|---|---|---|
| 3,098,214 | 7/1963 | Windes et al. | 340/825.03 |
| 3,268,866 | 8/1966 | Van't Slot et al. | 340/825.04 |
| 3,324,458 | 6/1967 | MacArthur | 340/172.5 |
| 3,522,587 | 8/1970 | Brown, Jr. | 340/825.03 |
| 3,761,689 | 9/1973 | Watanabe et al. | 340/825.79 X |
| 3,842,218 | 10/1974 | De Luca et al. | 379/29 X |
| 3,846,639 | 11/1974 | Ueda et al. | 307/9 |
| 3,869,578 | 3/1975 | Epstein | 364/514 |
| 3,891,965 | 6/1975 | Schroeder | 340/52 F |
| 4,258,421 | 3/1981 | Juhasz et al. | 364/424 |
| 4,271,402 | 6/1981 | Kastura et al. | 340/52 F |
| 4,276,605 | 6/1981 | Okamoto et al. | 364/481 X |
| 4,337,515 | 6/1982 | Kreft | 364/481 X |
| 4,344,136 | 8/1982 | Panik | 364/424 |
| 4,513,382 | 4/1985 | Faulkner, Jr. | 364/514 X |
| 4,577,191 | 3/1986 | Pargee, Jr. | 340/825.79 |

Primary Examiner—Parshotam S. Lall
Assistant Examiner—Joseph L. Dixon
Attorney, Agent, or Firm—Bernard E. Franz; Donald J. Singer

[57] ABSTRACT

An engineer, who is monitoring signals on oscilloscopes, can use one of a set of pushbuttons to select a specific channel for further monitoring on one or more other instruments. The switching network is controlled by a microprocessor and is designed to route any one of N (36) incoming analog signals to one of M (3) instrumentation inputs. The switching network is essentially M independent N-to-1 analog multiplexers comprising relays designed to function as a single system. The microprocessor insures that only one analog signal at a time can be selected for a single instrumentation channel, while permitting a signal to be simultaneously used on any or all of the remaining instrumentation channels. A second contact on each relay provides a signal to tell if the selected relay is energized.

4 Claims, 12 Drawing Sheets

SWITCHING NETWORK FOR MONITORING STATIONS

RIGHTS OF THE GOVERNMENT

The invention described herein may be manufactured and used by or for the Government of the United States for all governmental purposes without the payment of any royalty.

BACKGROUND OF THE INVENTION

This invention relates to a switching network for monitoring stations.

In a research and development laboratory, a monitoring station may have several monitor oscilloscopes connected to test points of equipment to monitor high response analog signals. An engineer may wish to select a specific channel being viewed for further viewing on advanced analysis instrumentation. The prior method of signal selection was by manually patching the signal through coaxial test leads, a method which is very slow and extremely cumbersome during testing. It would be highly desirable to have a switching network for making the connections.

There are a number of U.S. patents for monitoring test points. See for example U.S. Pat. No. 3,324,458 to MacArthur for "Monitoring Apparatus", U.S. Pat. No. 3,846,639 to Ueda et al for "Control System for Electric Installations for Use on Vehicle". U.S. Pat. No. 3,891,965 to Schroeder for "Time Division Multiplex System for a Motor Vehicle", U.S. Pat. No. 4,258,421 to Juhasz et al for "Vehicle Monitoring and Recording System", U.S. Pat. No. 4,271,402 to Kastura et al for "Motor Vehicle Diagnostic and Monitoring Device Having Keep Alive Memory", and U.S. Pat. No. 4,344,136 to Panik for "Device for Indication of Operational and Computed Values". However, no available product was suitable for performing the required switching function.

SUMMARY OF THE INVENTION

An objective of the invention is provide a switching network which will allow an engineer, who is monitoring signals, to select a specific channel for further monitoring on one or more other instruments.

The switching network according to the invention is controlled by a microprocessor and is designed to route any one of N (36) incoming analog signals to one of M (3) instrumentation inputs. The switching network is essentially M independent N-to-1 analog multiplexers designed to function as a single system. The novel features of the invention are that the microprocessor insures that only one analog signal at a time can be selected for a single instrumentation channel, while permitting a signal to be simultaneously used on any or all of the remaining instrumentation channels, and that a second contact on each relay provides means to tell if the selected relay is energized.

DETAILED DESCRIPTION

Figure 1:
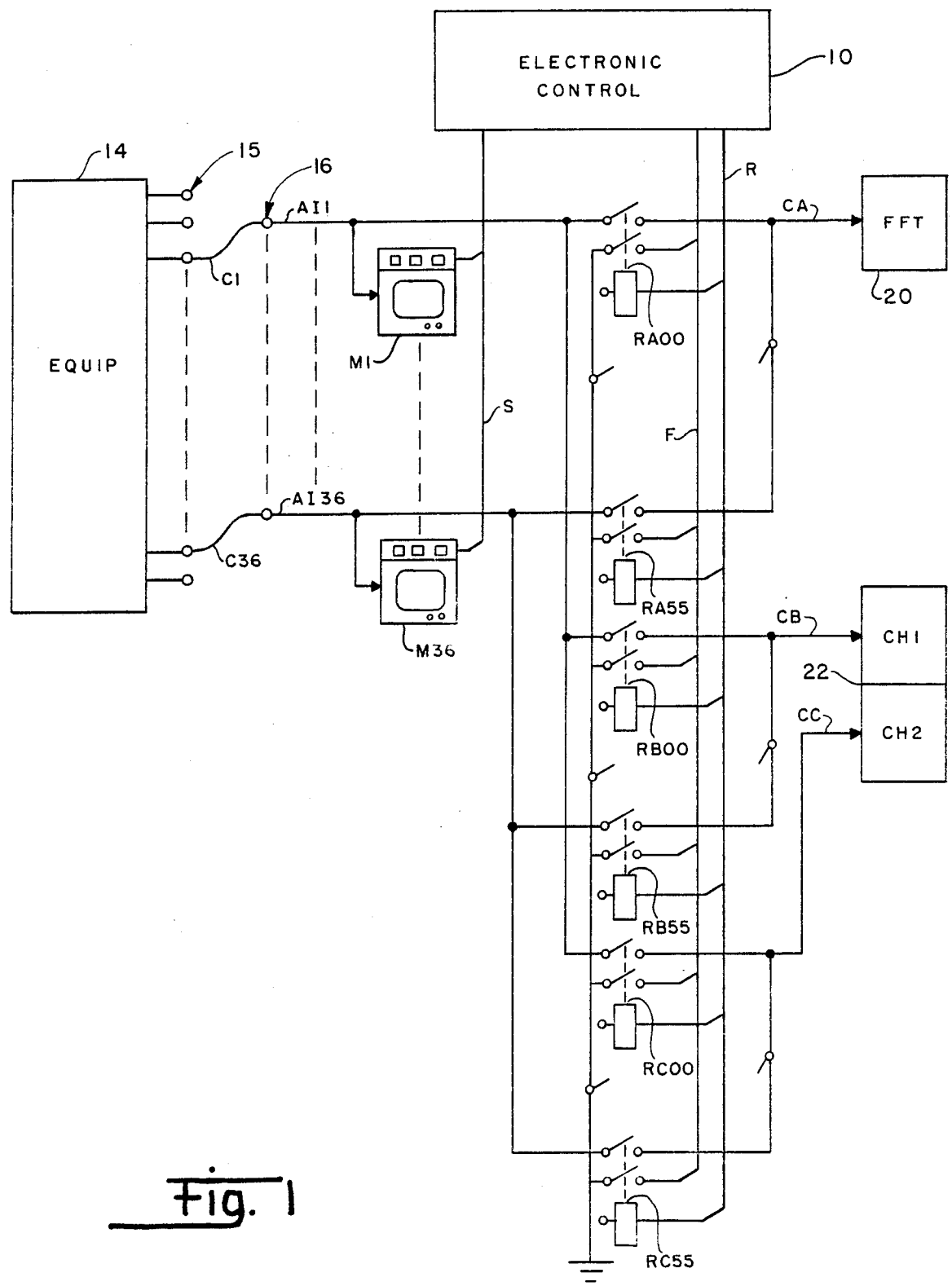
FIG. 1 is a block and schematic diagram showing the switching network connections from equipment test points to the monitoring apparatus.
Figure 2:
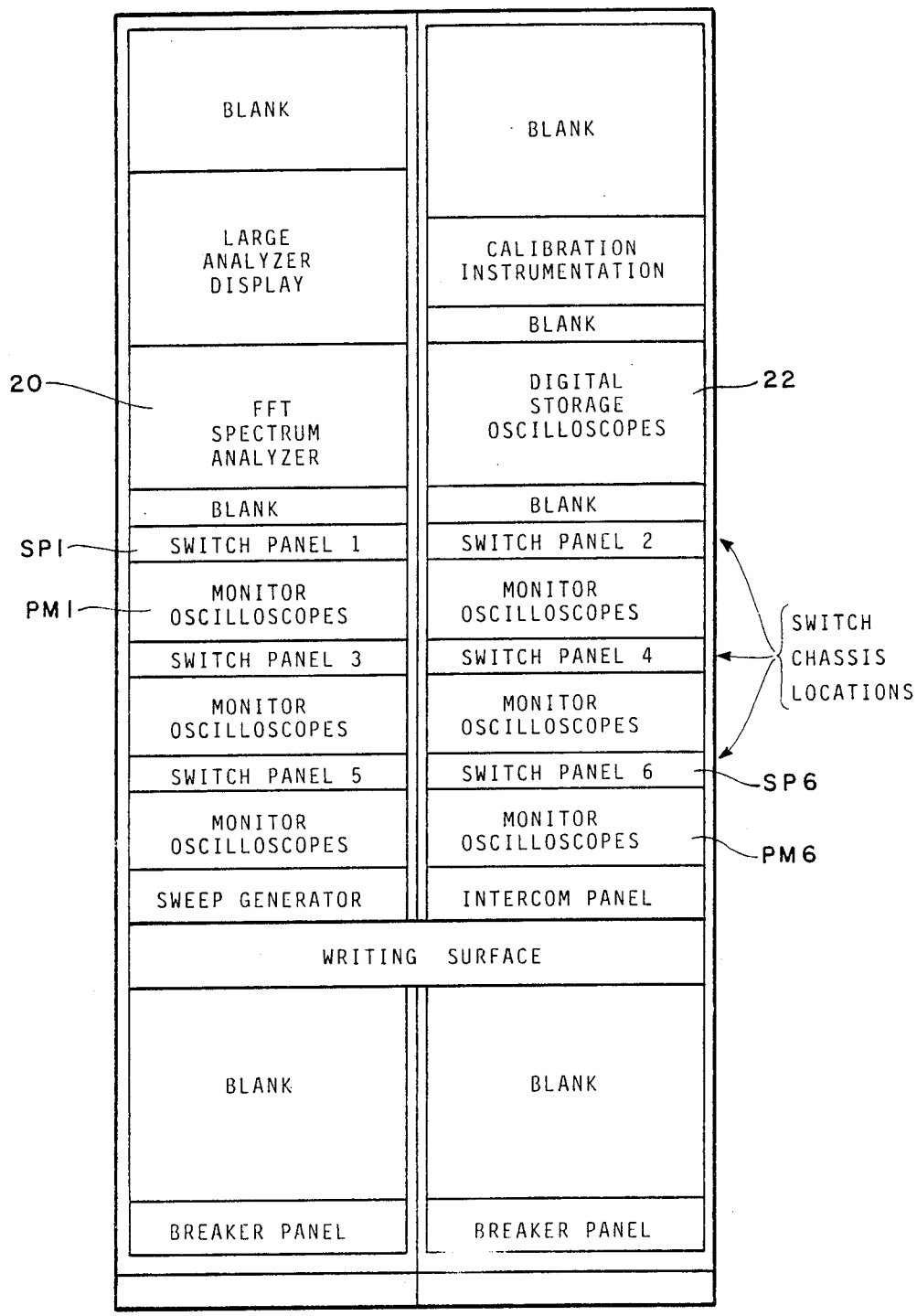
FIG. 2 is a diagram showing the location of rack-mounted apparatus in a monitoring station.

The switching network is a modular system which is designed to be placed into each of several Aeromechanical Monitoring Stations (AMS) at a Compressor Research Facility (CRF). FIG. 1 is a block and schematic diagram showing the switching network connections from equipment test points to the monitoring apparatus. The equipment 14 comprises experimental compressors. As shown in FIG. 2, the switch chassis are rack mountable in a standard 19-inch instrumentation cabinet, and are designed to be used with Tektronix RTM 506 power modules, each containing six Tektronix SC-501 oscilloscopes. There are six such power modules on panels PM1-PM6 in one station. FIG. 2 shows the exact location of six switching network chassis in the rack. There are six switch panels SP1-SP6 associated respectively with the six modules PM1-PM6. The switch chassis are modularly constructed, permitting interchangeability between different switch banks. Additional chassis can be added to the switching network. There are three independent output channels (CA, CB and CC) on the switching network which correspond to two specific pieces of electronic instrumentation, a single channel FFT spectrum analyzer 20 and a dual channel digital storage oscilloscope 22. As shown in FIG. 1, the two channel units of the digital storage oscilloscope 22 are designated CH1 and CH2.

Figure 3:
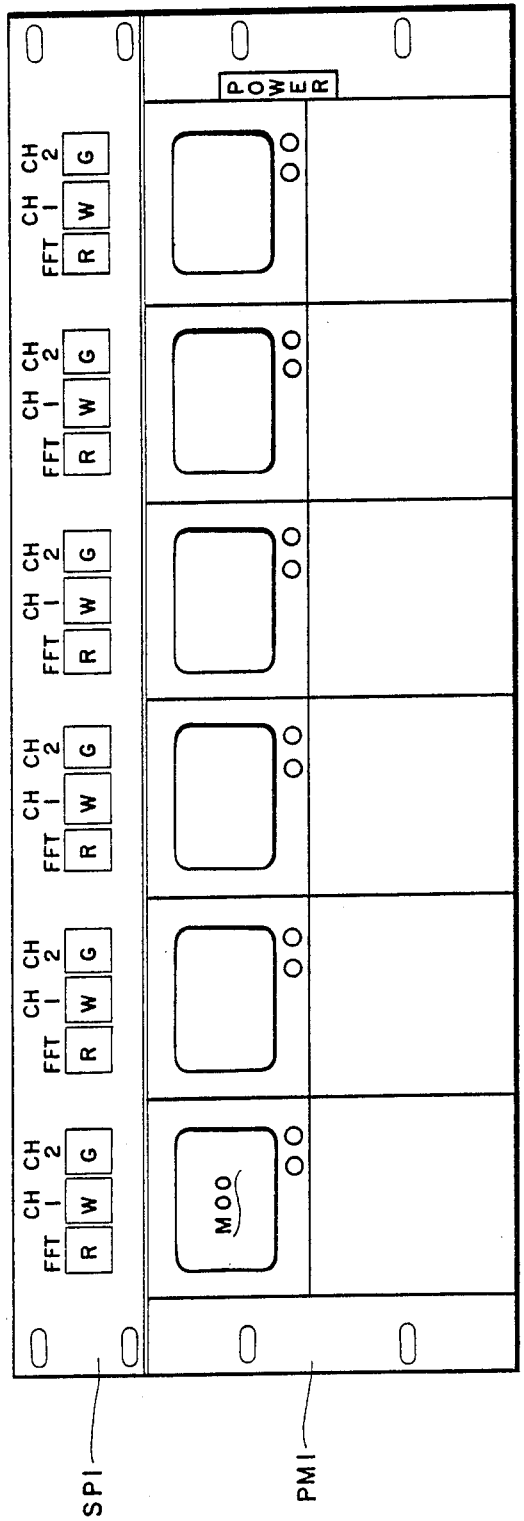
FIG. 3 is a diagram showing switch location on a panel.
Figure 4:
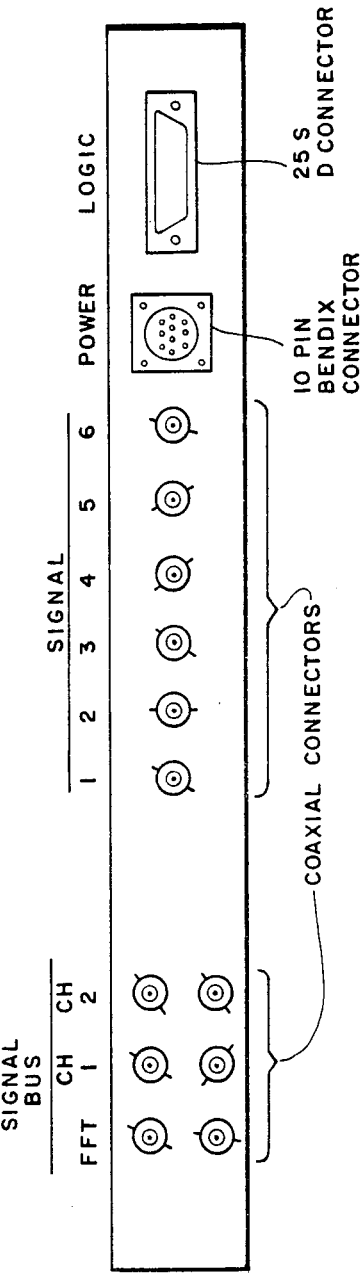
FIG. 4 is a diagram showing the back panel layout.

FIG. 3 is a front view and FIG. 4 is a rear view of a switch chassis comprising one power module PM1 and one switch panel SP1. The switch panel has six sets of pushbutton switches, each set being mounted above one of the monitor oscilloscopes of the panel PM1. The pushbuttons are color coded as indicated by the letters R, W and G, each color being associated with one of the three output channels (CA, CB and CC in FIG. 1). Each pushbutton has a light mounted within it to indicate when a connection is effective in the switching network. There are thirty-six analog input channels (AI1-AI36 in FIG. 1), with a maximum voltage swing of plus or minus ten volts, that are connected to each monitoring station. Each switch chassis is capable of handling six inputs. The three output buses connect on each chassis also. The connections for the input signals and the output buses are on the rear of the chassis, as shown in FIG. 4. The other connections are used to supply power and logic signals to each chassis. The switch chassis were designed to work in conjunction with the monitor oscilloscopes and power modules, therefore, chassis dimensions and switch locations are uniquely defined for this application.

FIG. 1 shows the switching network connections from equipment test points to the monitoring apparatus. The switching network is a microprocessor based system which is designed to route any of the thirty-six incoming analog signals on leads AI1–AI36 to one of three instrumentation inputs on leads CA, CB and CC. The switching network is essentially three independent 36-to-1 analog multiplexers designed to function as a single system. The first multiplexer comprises thirty-six relays RA00–RA55 (six numbered RA00, RA01, RA02, RA03, RA04, RA05; six numbered RA10–RA15, etc.), the second multiplexer comprises thirty-six relays RB00–RB55, and the third multiplexer comprises thirty-six relays RC00–RC55. Electronic control circuits shown as a block 10 include the microprocessor.

The equipment 14 (FIG. 1) has a number of test points connected to individual ones of a set of coaxial connectors 15. The signal leads AI1–AI36 have coaxial connectors 16 (six on the rear of each switch chassis) which for any particular test run are connected via coaxial lines C1–C36 and connectors 15 to desired test points. The signal leads AI1–AI36 are connected individually to the thirty-six monitor oscilloscopes M1–M36, and also to the switching network. Associated with each of the monitor oscilloscopes is the set of three manual selection switches with lights, which are shown in FIG. 1 as being connected to the electronic circuits via a set of conductors S.

The leads from the electronic circuits to the relay coils are shown in FIG. 1 as a set of conductors R. A first normally open contact of each relay is used to selectively connect one of the leads AI1–AI36 to one of the three leads CA, CB or CC. A second normally open contact on each relay is used as a means to tell if the selected relay is energized. This feature allows an operator to be notified if the channel that was selected has not been engaged to the desired instrumentation input. FIG. 1 shows these contacts connected to the electronic circuits via a set of conductors F.

Figure 5:
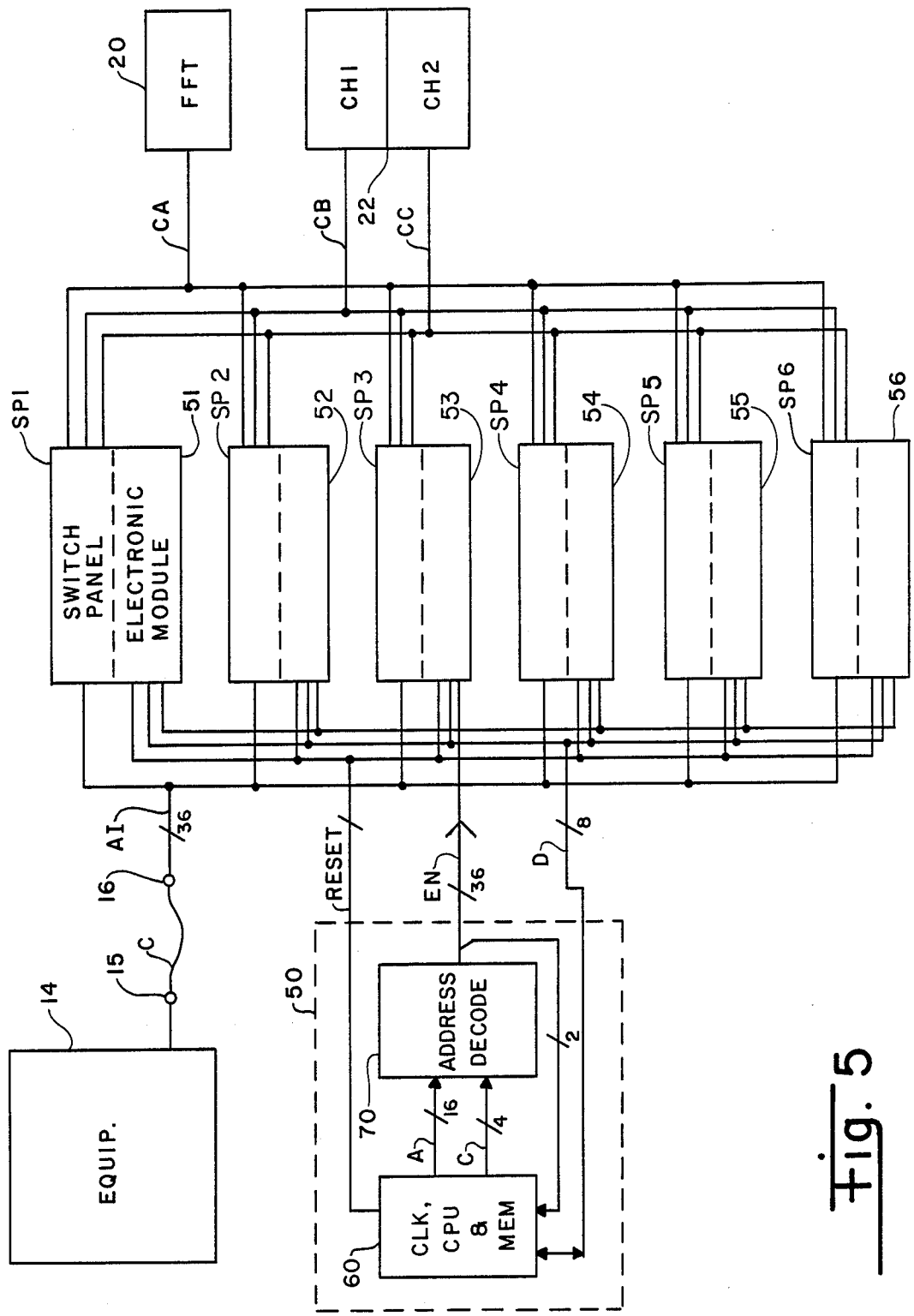
FIG. 5 is a block diagram of the switching network.

The switching network is controlled electronically. An 8-bit Z80 microprocessor is used as the Central Processing Unit (CPU). Standard Transistor-to-Transistor logic (TTL) circuitry. along with the CPU, make up the electronic control circuitry of the switching network. FIG. 5 is a block diagram of the entire switching network, with inputs from test points of the equipment 14, and outputs to the units 20 and 22. Since the switching network has been designed with modularity in mind, separation of the electronic functions followed the same rule. There is a need for seven circuit boards, one CPU board 50, and six switch chassis boards 51–56. For convenience on the drawing, each switch panel is shown with its associated electronic board. The CPU circuit board 50 contains all control circuitry as well as the various function enable devices. The switch chassis circuit boards 51–56 contain all switch detect, relay energize and switch backlight, and feedback sensing circuitry for each chassis.

Figure 6:
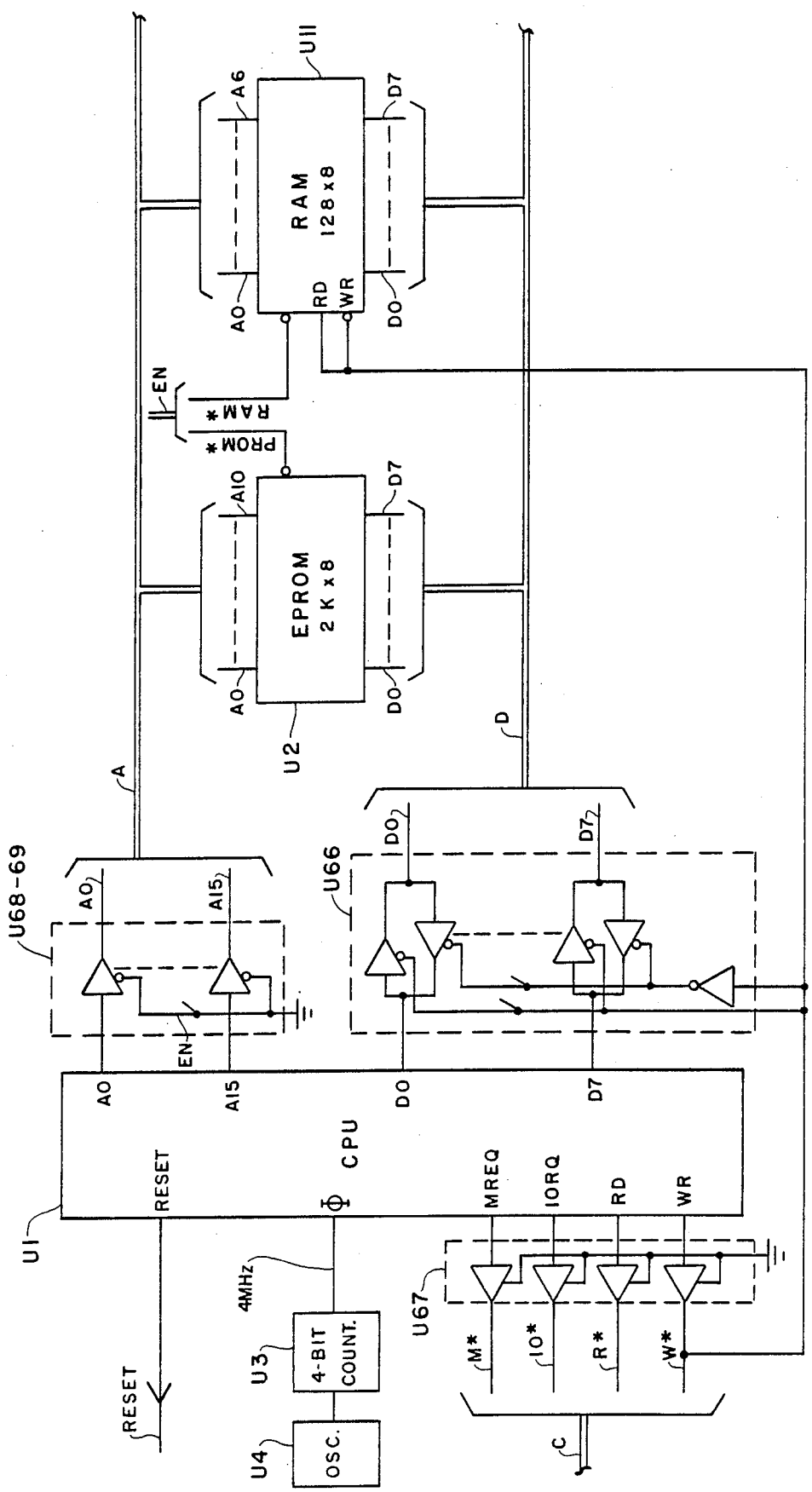
FIG. 6 is a functional block diagram of the microprocessor and memory.
Figure 7:
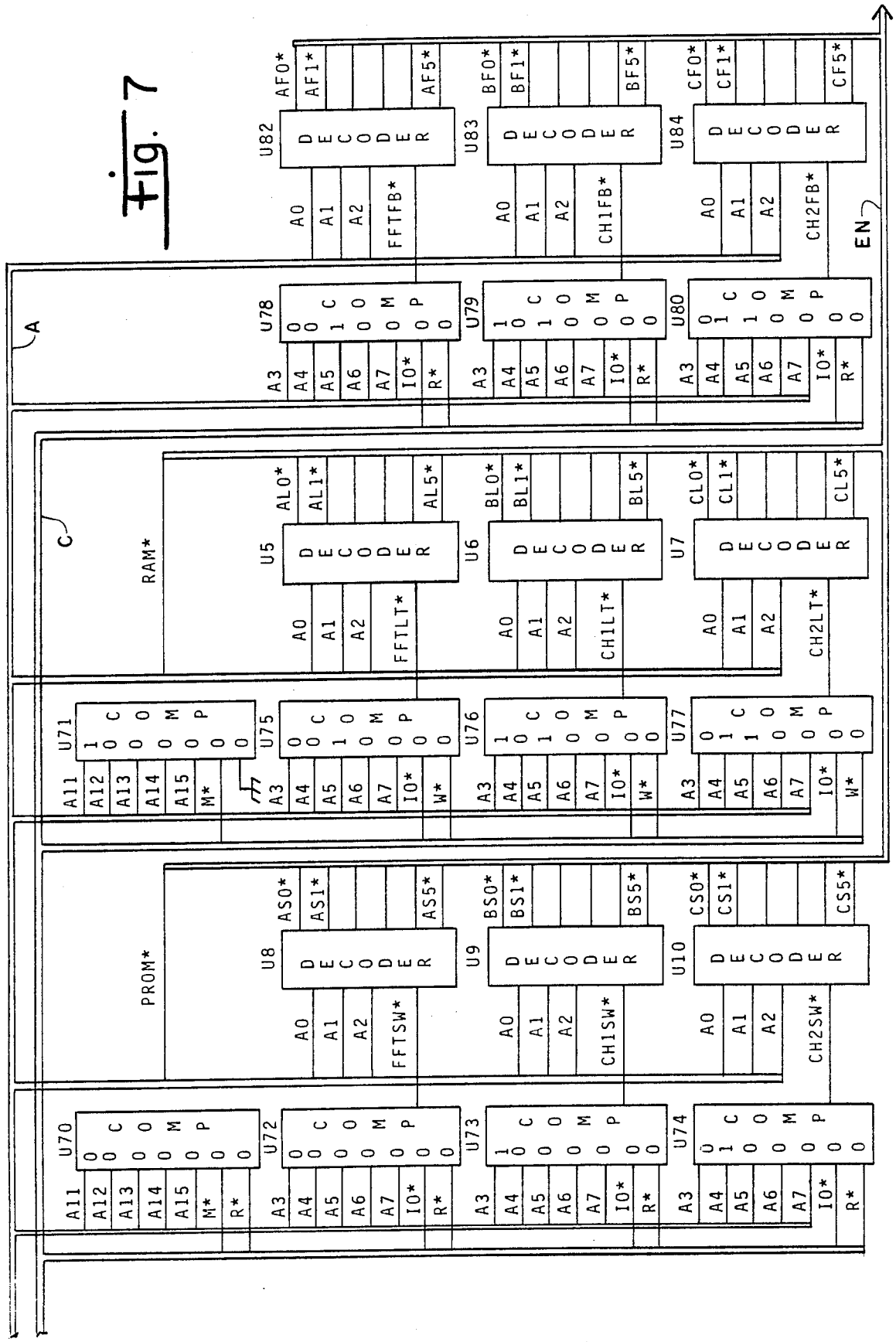
FIG. 7 is a functional block diagram of address decode electronic circuits for one of six switch panels.

For the CPU circuit board, the clock, CPU and memory circuits 60 are shown in FIG. 6, and the address decode circuits 70 are shown in FIG. 7. The clock comprises a 16-MHz oscillator U4 and a 4-bit counter U3 to provide a 4-MHz signal to the phi input of the CPU U1. The CPU U1 has its reset terminal connected to lead RESET; the terminals MREQ, IORG, RD & WR coupled via line drivers U67 to leads M*, IO*, R* & W* respectively of a set of conductors C; the 16 address terminals coupled via line drivers U68–69 to leads A0–A15 of an address bus A; and the eight data terminals coupled for input or output via line drivers U66 to leads D0–D7 of a data bus D. The asterisk indicates a lead on which the signal is active when low. An 8K×8 EPROM memory U2 has inputs A0–A10 from the address bus A, and outputs D0–D7 to the data bus D. A 128×8 RAM memory U11 has inputs A0–A6 from the address bus A, and input/outputs D0–D7 to the data bus D.

In the address decode circuits shown in FIG. 7, there are eleven comparator chips U70–U80 which have two sets of inputs P and Q, each having eight terminals, which are compared and if all are equal, a low signal is produced at an output. The P inputs are used for address signals from the bus A and for control signals from the set of conductors C. The Q inputs are connected to either +5 volts or ground, shown in the drawing as a 1 or a 0 next to the correspondign P input. The eight input of each set is always connected to ground, and therefore not shown. The comparator inputs and outputs are shown in the following table.

| Comparator | P Inputs | Q value | Output | To |
|---|---|---|---|---|
| U70 | A11–A15, M*, R* | 0000000 | PROM* | Memory U2 |
| U71 | A11–A15, M*, 0 | 1000000 | RAM* | Memory U11 |
| U72 | A3–A7, IO*, R* | 0000000 | FFTSW* | Decoder U8 |
| U73 | A3–A7, IO*, R* | 1000000 | CH1SW* | Decoder U9 |
| U74 | A3–A7, IO*, R* | 0100000 | CH2SW* | Decoder U10 |
| U75 | A3–A7, IO*, W* | 0010000 | FFTLT* | Decoder U5 |
| U76 | A3–A7, IO*, W* | 1010000 | CH1LT* | Decoder U6 |
| U77 | A3–A7, IO*, W* | 0110000 | CH2LT* | Decoder U7 |
| U78 | A3–A7, IO*, R* | 0010000 | FFTFB* | Decoder U82 |
| U79 | A3–A7, IO*, R* | 1010000 | CH1FB* | Decoder U83 |
| U80 | A3–A7, IO*, R* | 0110000 | CH2FB* | Decoder U84 |

There are nine three-to-eight decoder chips U5–U10 and U82–U84 each of which has an enable input (terminal 4) connected to the output of one of the comparator chips, as shown in the above table. Terminals 1, 2 and 3 of each decoder, weighted 1, 2 and 4 respectively, are used for inputs on leads A0, A1 and A2 of the address bus A. Six of the terminals 15–10 are used for outputs with values 0–5 respectively. Terminals 6 and 5 are connected to +5 volts and ground respectively, and decode terminals 7 and 9 have no connection. A set of 56 conductors EN includes nine decoder outputs to each of the electronic modules 51–56, as shown in FIG. 5, and two comparator outputs to the memories in block 60. The outputs from decoder U8 are AS0*–AS5* from U9 are BS0*–BS5*, from U10 are CS0*–CS5*, from U5 are AL0*–AL5*, from U6 are BL0*–BL5*, from U7 are CL0*–CL5*, from U82 are AF0*–AF5*, from U83 are BF0*–BF5*, and from U84 are CF0*–CF5*.

Figure 8:
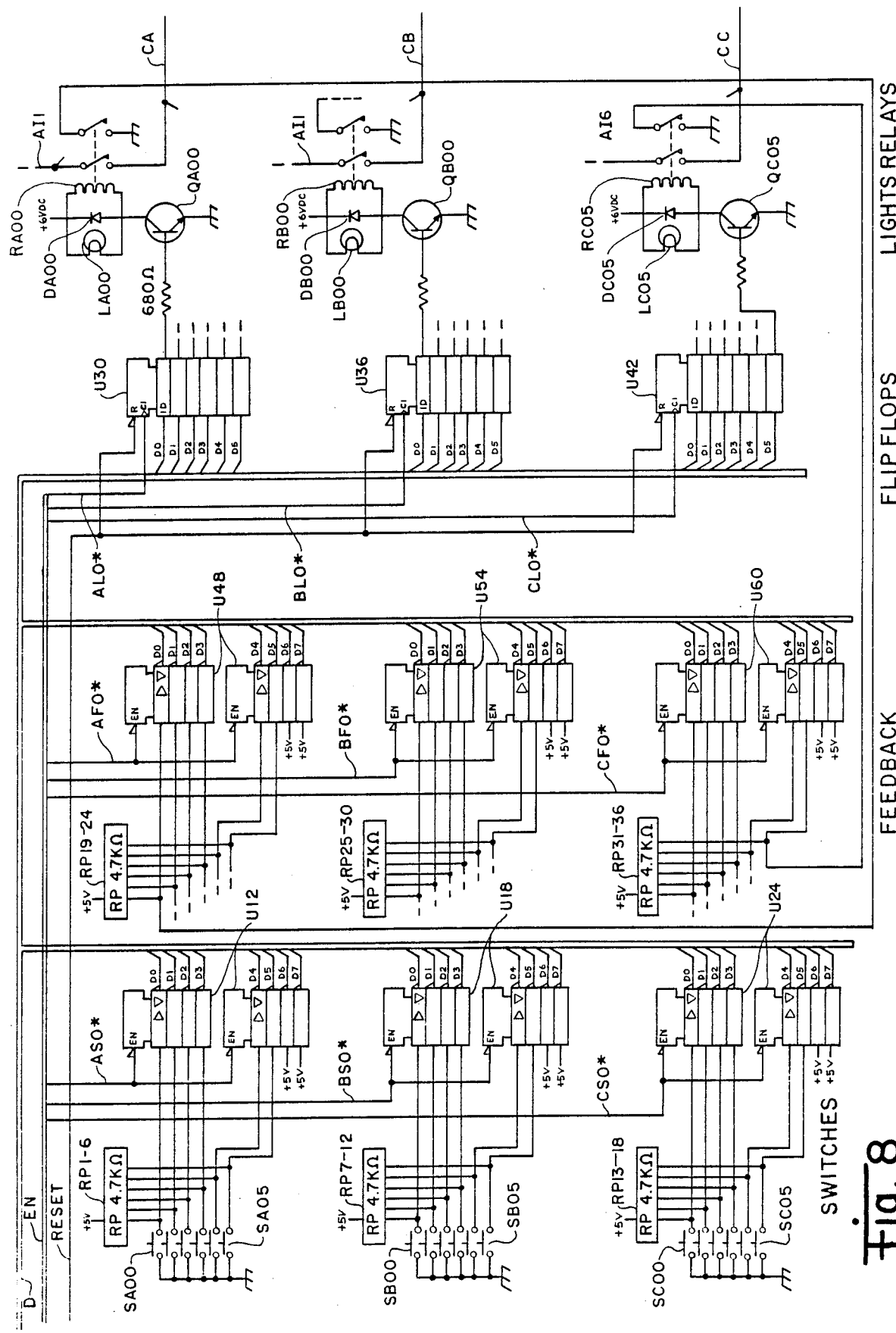
FIG. 8 is a functional block diagram of the switching circuits for one switch panel.

FIG. 8 is a functional block diagram of the switching circuits for one switch panel SP1 and its electronic module 51. There are nine enable leads, one from each of the decoders in FIG. 7, in the set of conductors EN.

The six red switches labeled FFT in FIG. 3 are shown here as switches SA00–SA05, each having one side grounded and the other side connected to a 4700-ohm load resistor of a set RP1-6 to +5 volts, and also to the input of a line driver of a chip U12, which is enabled by a low signal on lead AS0*.

The six white switches labeled CH1 in FIG. 3 are shown here as switches SB00–SB05, each having one side grounded and the other side connected to a 4700-ohm load resistor of a set RP7-12 to +5 volts, and also to the input of a line driver of a chip U18, which is enabled by a low signal on lead BS0*.

The six green switches labeled CH2 in FIG. 3 are shown here as switches SC00–SC05, each having one side grounded and the other side connected to a 4700-ohm load resistor of a set RP13–18 to +5 volts, and also to the input of a line driver of a chip U24, which is enabled by a low signal on lead CS0*.

The module 51 has three chips U30, U36 and U42, each having six D-type flip flops, with the six D inputs of each chip connected respectively to lead D0–D5 of the data bus D. The three chips have their clock inputs connected respectively to enable leads AL0*, BL0* and CL0*; and their reset inputs all to the lead RESET*. The Q outputs of chip U30 are connected via respective 680-ohm resistors to the base inputs of six transistors QA00–QA05, only the first being shown, the Q outputs of chip U36 are connected via respective 680-ohm resistors to the base inputs of six transistors QB00–QB05, only the first being shown, and the Q outputs of chip U42 are connected via respective 680-ohm resistors to the base inputs of six transistors QC00–QC05, only the last being shown.

Each of the eighteen transistors QA00–QC05 has its emitter connected to ground. The transistor QA00 has its collector connected to a circuit comprising a lamp LA00, a diode DA00 and a relay winding RA00 in parallel to +6 volts; and the other seventeen transistors have similar collector circuits. The six relays RA00–RA05 have contacts for respectively connecting the analog signal leads AI1–AI6 to output signal lead CA, the six relays RB00–RB05 have contacts for respectively connecting the analog signal leads AI1–AI6 to output signal lead CB, and the six relays RC00–RC05 have contacts for respectively connecting the analog signal leads AI1–AI6 to output signal lead CC.

Each of the eighteen relays also has a second set of contacts for feedback, each having one side connected to ground, and the other side connected to a 4700-ohm load resistor and to the input of a line driver. For relays RA00–RA05 the load resistors are RP19–24 and the line drivers are on a chip U48. For relays RB00–RB05 the load resistors are RP25–30 and the line drivers are on a chip U54. For relays RC00–RC05 the load resistors are RP31–36 and the line drivers are on a chip U60. (An alternative for the light indicator for each switch, in place of the lamp in parallel with the relay winding, would be to include a lamp or other light-emitting device in the circuit of the feedback contact, so that when the contacts are in the closed state the light would be on.)

The line drivers of each of the six chips U12, U18, U24, U48, U54 and U60 are connected to leads D0–D7 of the data bus D, but the inputs of the line drivers for leads D6 and D7 are always at +5 volts.

The following table shows the type number and function of the integrated circuit chips for all seven electronic modules.

| Reference | Type Number | Function |
| --- | --- | --- |
| U1 | Z80A | CPU |
| U2 | 2716-1 | PROM |
| U3 | 74LS193 | 4-bit Counter |
| U4 | XO-33B160 | 16-MHz Osc. |
| U5–U10 | 74LS138 | 3-to-8 Decode |
| U11 | 6810P | RAM |
| U12–U29 | 74LS240 | Line Drivers or Buffers |
| U30–U47 | 74LS174 | D-type Flip Flops |
| U48–U69 | 74LS240 | Line Drivers or Buffers |
| U70–U80 | 74ALS688 | 8-Bit Comparators |
| U82–U84 | 74LS138 | 3-to-8 Decode |

The lamps may be type 7377 T 3/4, the diodes type IN914, the relays type 951A05B2A form 2A, and the transistors type MPSA12 NPN Darlington (TO-92).

Figure 9:
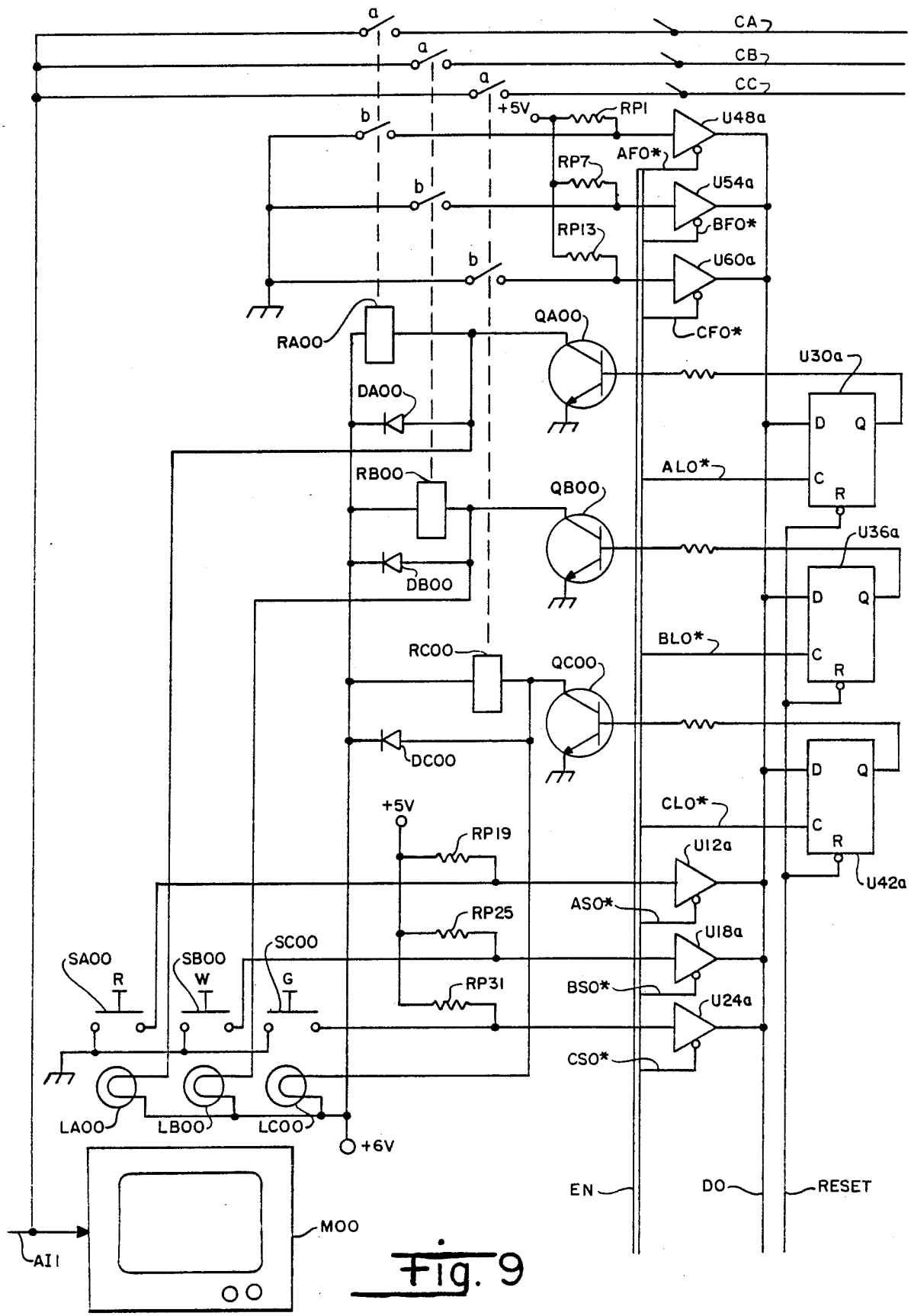
FIG. 9 is a functional block and schematic diagram of the portion of the circuit associated with one monitor oscilloscope.

FIG. 9 is a schematic and functional block diagram showing the switch panel and electronic circuits of FIG. 8 which are individually associated with one of the monitor oscilloscopes M00, to more readily see the overall operation. The analog signal input AI1 is connected to the oscilloscope M00, and to contacts of three relays RA00, RB00 and RC00. One, two or all three of these relays can be in the operated state at any time. The following operational description can be traced in either FIG. 8 or FIG. 9. When switch SA00 is operated, the input of the buffer driver U12a goes low, and when the CPU supplies address and control signals for chips U72 and U8 in FIG. 7 and the signal on the enable lead AS0* also goes low, a high signal appears on lead D0 of the data bus. During its cycle of operation, the CPU will read this signal, and if the output to lead CA is not busy it will supply a high signal on lead D0, and the required address and control signals to the chips U75 and U5 in FIG. 7 to produce a low pulse signal on the enable lead AL0*. The data is clocked into the flip flop U30a when the enable signal transitions from active to inactive. The Q output goes high to turn on the transistor QA00, which operates the relay RA00 and lights the lamp LA00. The signal lead AI1 is thereby connected via the a contacts of the relay to lead CA, and the feedback contacts b of the relay place ground at the input of the buffer U48a. The CPU then applies the address and control signals to chips U78 and U82 in FIG. 7 to produce a low pulse on the enable lead AF0*, and reads the signal on lead D0 to determine if the relay has been actuated.

Figure 10A:
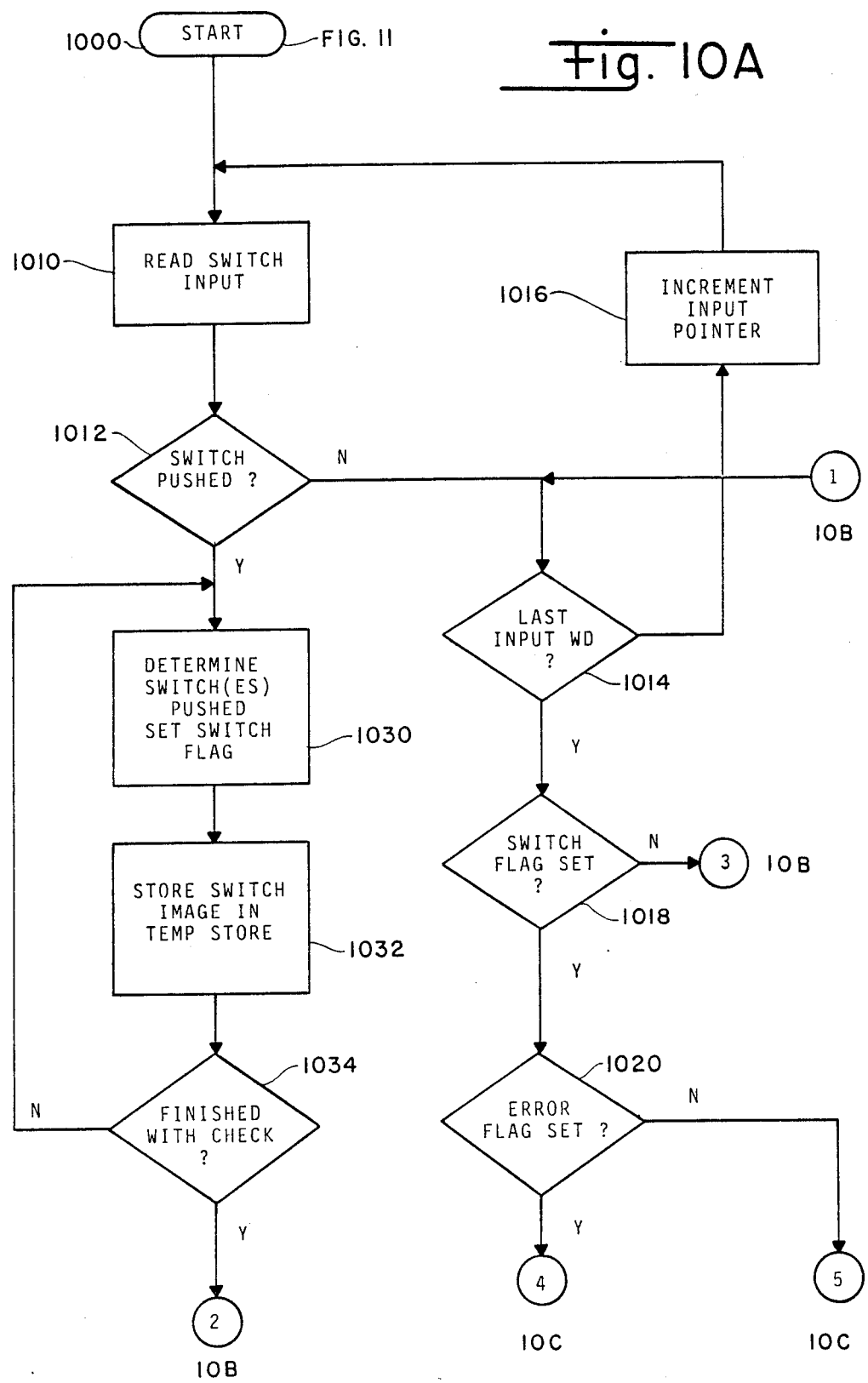
FIGS. 10A, 10B and 10C comprise a flow chart showing the general switch routine for a single channel.
Figure 10B:
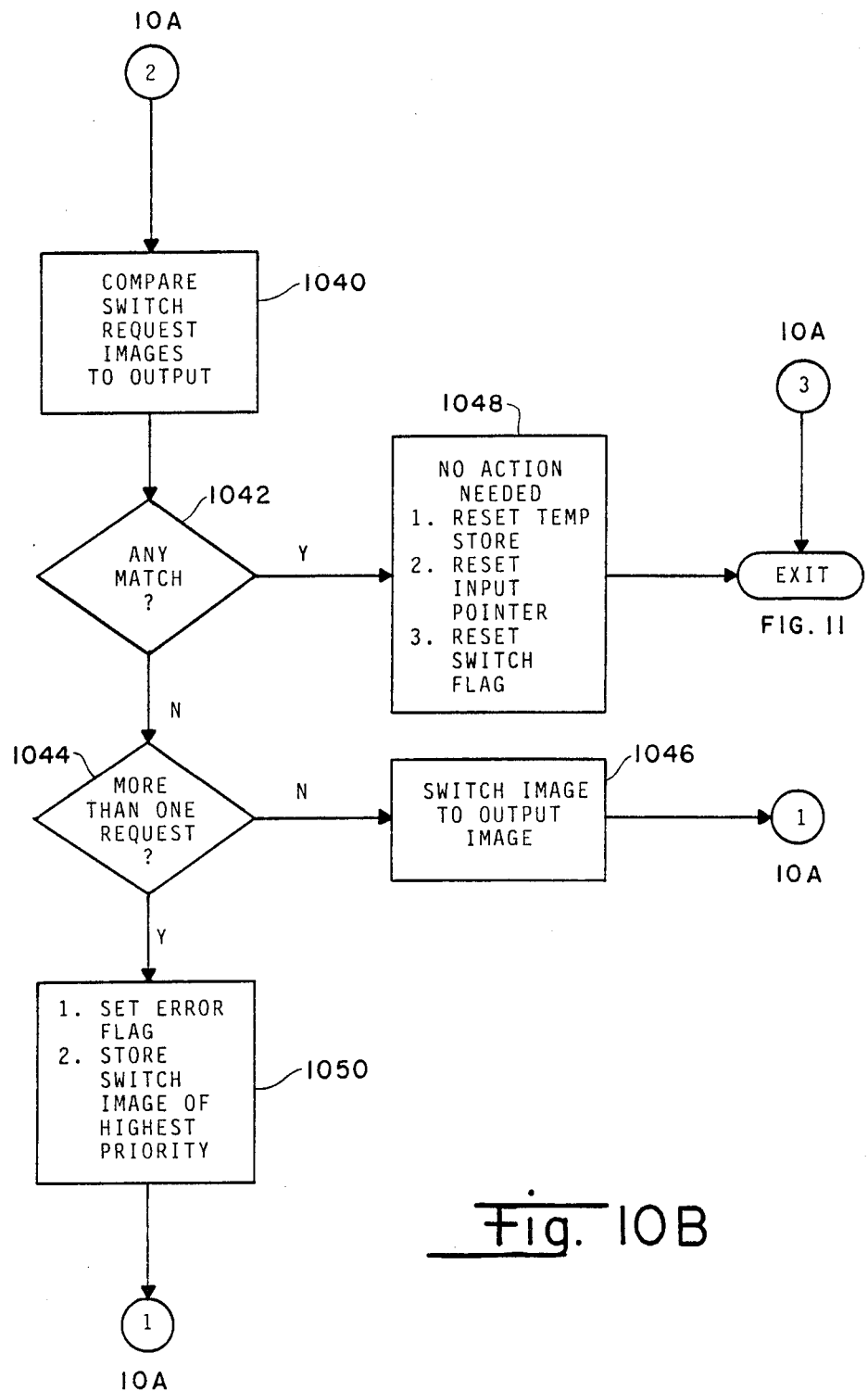
Figure 10C:
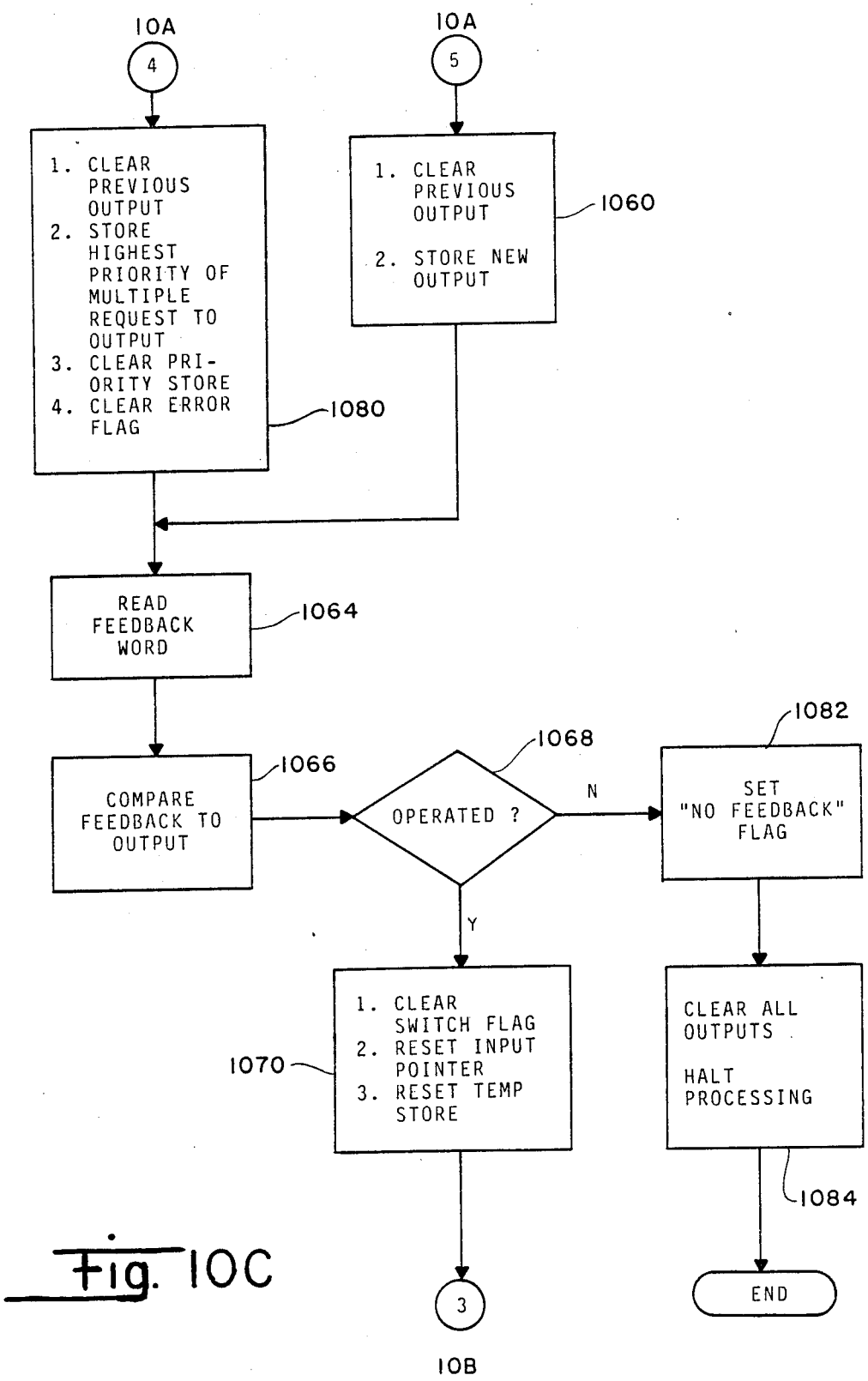
Figure 11:
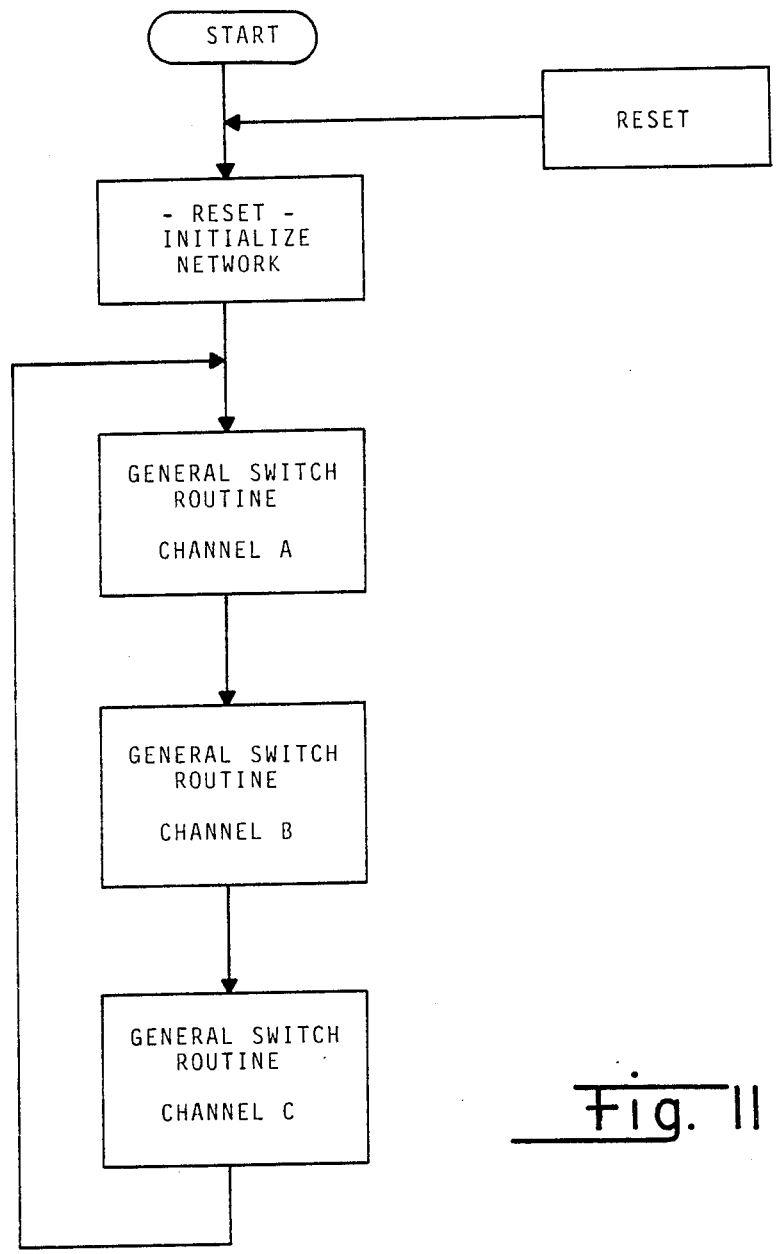
FIG. 11 is a flow chart showing the overall switch routine.

The process of switching signals is performed under software control. It is the software that insures all functions are carried out properly. The general switch routine for a single channel is shown in FIGS. 10A, 10B and 10C. This routine is the same for each of the three output channels. In order for the switching network to function as a system, it is necessary for three separate general switch routines to be tied together. This is illustrated in FIG. 11. The overall switch routine shows that channel A (FFT) is serviced first, followed by channel B (CH1), then channel C (CH2). After channel C (CHZ) is finished, the process of switch select servicing continues in an endless loop. A reset signal causes the system to start back at channel A. The reset occurs at the time of power-up, and also whenever a special hard-wired pushbutton (not shown) is operated.

There are a few features that the general switch routine does that warrant an explanation. Any one of the thirty-six input signals can be selected for any or all of the other output channels simultaneously. When another channel is selected for an output channel, the previous channel is cancelled first before the new channel is selected. This "break-before-make" action provides electronic (rather than mechanical) interlock that prevents more than one input signal on a given output channel at the same time, thereby reducing the possibility of signal conditioning equipment damage. When a channel is selected, all outputs are cleared, a check for multiple requests (more than one button pushed for the same output channel), the relay for the selected channel is energized, and the feedback contact is checked to insure that the desired channel is actually connected to the output channel. If more than one request is made a decision takes place. If one of the selected channels is the same as the currently activated input, no action takes place. If the selected channels are different than what is currently activated, the switch with the lowest number takes precedence and is selected over the other channel(s). A switching network operator is notified that a successful selection has been made when the push button of the selected input channel becomes illuminated. If a push button fails to illuminate, then one of two things happened: the light bulb has burned out, or the feedback contact indicates that the relay was never energized. Either of these conditions requires immediate attention.

Referring to FIG. 11, when the system is powered up, the CPU U1 in FIG. 6 will initialize itself and the temporary memory circuits U11, during which time the line RESET is held low, causing all flip flops in the modules 51–56 to be placed in the "0" state to initialize the network. The line RESET then goes high (inactive), and remains in that state during normal operation. Program instructions are read from the PROM U2, by making active the MREQ and RD lines of the CPU and supplying an address of all zeroes on lines A11–A15 to make the output PROM* of the comparator U70 (FIG. 7) low, and supplying a selected address on lines A0–A10 to place an instruction on the data bus D. The RAM U71 is used as the temporary memory, which is selected by making active the MREQ output of the CPU, with address bit AI1 a "1" and bits A12–A15 "0" to make low the signal on line RAM* from the comparator U71, with a selected address on address lines A0–A6. Normally the chip U11 is in the read state, and is changed to the write state by the CPU making its output WR active. The program proceeds to the general switch routine for channel A.

Initially assume that none of the red, white or green switches on any of the switch panels is operated. Referring to FIG. 10A, the operation for the first channel starts at the block 1000, and proceeds to block 1010 to read switch inputs. The outputs IORQ and RD of the CPU become active and address bits A3–A7 all zeroes to make the signal on line FFTSW* from comparator U72 active, which enables the decoder US (FIG. 7). The address bits A0–A3 will be 000 to make the signal on line AS0 active and enable the buffer chip U12 (FIG. 8), to thereby read the state of the six switches SA0-0–SA05 onto the data bus D. The buffer chip U66 is normally enabled for read to supply the data to the CPU. Note that although there are only six switches read at a time, the data word has eight bits, the last two always being "0".

At the decision block 1012, the bits from the data bus are examined to see if any have become a "1". If the answer is "no", the decision block 1014 determines if this is the last word. Since this was the first word, the answer is "no", and the program goes to block 1016 to increment an input pointer. The address bits A0–A3 become 001, so that the output of decoder U8 becomes active on line AS1* as the program returns to block 1010 to read switch inputs for the second panel SP2, switches SA10–SA15. Operation in this loop continues until the last input word (for panel SP6) is read, following which the path from the decision block 1014 for "last input word?" is "yes".

The program goes to decision block 1018 to check whether there is any switch flag set. The answer is "no", so the program exits for this switch routine, and proceeds with the routine for channel B in FIG. 11. The status of switches SB00–SB55 are checked and found idle, and the program proceeds to channel C. The status of switches SC00–SC55 are checked and found idle, and the program returns to channel A. This operation continues until a switch is found to be operated.

Now assume that one switch, such as switch SA00, is pushed. This time at block 1010, the program will read a data word 1000 0000. At the decision block 1012 the answer is "yes", and the next operation is to determine which switch or switches have been pushed, to set a switch flag, and to store the switch image in temporary memory, examining the bits of the data word one by one in a loop comprising blocks 1030, 1032, and 1034. The next step at block 1040 (FIG. 10B) is to compare the switch request image to the output image. There being no previous output, the decision at block 1044 is "no", with only one request the decision at block 1044 is "no", and the operation proceeds to block 1046. The switch image is copied to the output image at block 1046, and the program proceeds to block 1060 (FIG. 10C). To clear the previous output (if there had been one), a data word of all zeroes is placed on the data bus, with the IORQ and WR outputs of the CPU active, and the address for the switch panel is placed on the address bus. This is the address which selects the comparator U75 in FIG. 7 to enable the decoder U5, with the bits A0–A2 selecting one of the outputs AL0–AL5. This supplies a clock pulse to the corresponding chip having six flip flops, such as chip U30 in FIG. 8. With zeroes at the D inputs of of the flip flops, they will all be placed in the reset state, which turns off the transistor for the previous output and releases the relay. This completes the break part of the break-before-make operation. To store the new output, the switch image word is placed on the data bus, and the address for the new output is placed on the address bus. This is still the address which selects comparator U75 to enable decoder U5, with bits A0–A2 designating the new switch panel, which we have assumed to be panel SP1. Now a pulse on lead ALO* clocks the set of flip flops on chip U30. Since it has been assumed that switch SA00 was pushed, the bit D0 is high to set the flip flop U30a (see FIGS. 8 and 9), which energizes the relay RA00. At block 1064, the feedback word is read by using the address for comparator U78 with IO* and R* active to enable the decoder U82, and the address 000 on bits A0–A2 to place an active signal on lead AF0*. This enables the chip U48 in FIGS. 8 and 9, and reads the data from the feedback contacts. Blocks 1066 and 1068 show comparing the feedback to the switch image, and if yes they are the same, the operation goes to block 1070. Now the switch flag is cleared, the input pointer is reset, and the temporary store is reset, and the program exits to the routine for the next channel.

The above covers the principal operations. The first possible variation in the flow chart is that the operator has pushed a switch which is already lit. In this case the comparison at blocks 1040 and 1042 will find a match and branch to block 1048. The same input should remain selected so no action is needed. The temporary memory, input pointer, and switch flag are reset, and the routine for that channel is exited.

If there is more than one switch pushed for the same channel, then the decision at block 1044 causes a branch to block 1050, where an error flag is set, and a priority routine executed to store the switch image of the highest priority. At the next block 1080 (FIG. 10C), the operation is similar to that for block 1060 to clear the previous output, and to energize the relay for the highest priority. The priority store and error flags are then cleared, and the operation continues at block 1064 as for the operation with a single request from block 1060.

If the feedback contact is not operated, the program branches to block 1082 to set a flag, and then to block 1084 to clear all outputs and halt processing, so that the cause of the problem may be found and corrected.

It is understood that certain modifications to the invention as described may be made, as might occur to one with skill in the field of this invention, within the scope of the appended claims. Therefore. all embodiments contemplated hereunder which achieve the objects of the present invention have not been shown in complete detail. Other embodiments may be developed without departing from the spirit of the invention or from the scope of the appended claims.

What is claimed is:

1. A switching system having a network for a monitoring station comprising N monitor units, each unit having an individual input channel for an analog signal to be monitored, and the station having M instrumentation units for additional monitoring of the analog signals, M and N being integers greater than one;

wherein said network comprises (M×N) relays, M of which are individual to each of said monitor units, each relay having a winding and two sets of normally open contacts, one set being signal contacts and the other set being feedback contacts, the M relays for each monitor unit having one side of the signal contacts connected together to the input channel for that unit, and the other side connected individually to M output channels, each output channel being coupled to an individual one of the instrumentation units, whereby the network is essentially M independent N-to-1 analog multiplexers designed to function as a single system;

wherein each of the monitor units has M manual switches for output channel selection, each of the switches being individually associated with one of the relays, and having an associated light-emitting is in an operated state;

electronic control means comprising common circuits and other circuits;

wherein the common circuits comprise a microprocessor, a source of clock signals coupled to an input of the microprocessor, an address bus coupled to outputs of the microprocessor, a data bus coupled to input/outputs of the microprocessor, a set of control leads coupled to outputs of the microprocessor, a reset lead coupled to an output of the microprocessor, address decode means with inputs coupled to the address bus and the set of control leads, a set of enable leads coupled from outputs of the address decode means, program memory means having inputs coupled to the address bus and one of the enable leads and outputs coupled to the data bus, temporary memory means having inputs coupled to the address bus and one of the enable leads and input/outputs coupled to the data bus;

wherein said other circuits comprise, individual to each of said manual switches, a switch buffer device, a feedback buffer device, and a flip flop, with the switch buffer device having a signal input coupled to the associated manual switch, an enable input coupled to one of the enable leads, and an output coupled to one lead of the data bus, with the feedback buffer device having a signal input coupled to the feedback contacts of the associated relay, an enable input coupled to one of the enable leads, and an output coupled to said one lead of the data bus, and with the flip flop having a data input coupled to said one lead of the data bus. a clock input coupled to one of enable leads, a reset input coupled to the reset lead, and an output coupled to the winding of the associated relay;

a program stored in the program memory having an overall routine comprising initialize means followed by general switch routine means for each of the M channels in sequence and back to the first channel in a loop which continues as long as the system is on and operation is normal;

in which the initialize means includes commands to cause the microprocessor to supply a signal via the reset lead to reset all of the flip flops;

in which the general switch routine means for each channel comprises commands for supplying signals via the address bus and the set of control leads to the address decode means to cause signals from the address decode means via the enable leads to select the switch buffer devices for that channel, to thereby read switch inputs onto the data bus, and to analyze the inputs to determine if any of the manual switches for that channel are operated; a decision command responsive to no manual switch being operated to branch and proceed to the general switch routine for the next channel, or responsive to at least one switch input indicating an operated manual switch to select one, to clear previous output for that channel with a command to reset any previously operated relay, to store the new output and cause signals to be supplied to operate the relay corresponding to the selected switch, followed by commands to read the status of the feedback contact for that relay, and in response to a signal indicating operation of the relay to restore the common circuits to a normal condition, and to proceed to the general switch routine for the next channel;

wherein the general switch routine means for each channel includes commands responsive to more than one request to make a decision, so that if one of the selected input lines is the same as the currently activated input, no action takes place, but if the selected input lines are different than what is currently activated, a precedence operation determines which is selected.

2. A switching system according to claim 1, wherein the monitor units are organized into P groups of Q units each, wherein the data bus comprises parallel leads for at least Q bits, each group having M sets of said switch buffer devices, one set for each channel, M sets of said feedback buffer devices, one set for each channel, and M sets of said flip flops, one set for each channel, the switch buffer devices of each set having their enable inputs coupled in parallel to the same enable lead and their outputs to individual leads of the data bus, the feedback buffer devices of each set having their enable inputs coupled in parallel to the same enable lead and their outputs to individual leads of the data bus, and the flip flops of each set having their clock inputs coupled in parallel to the same enable lead and their data inputs to individual leads of the data bus.

3. A method using a central processing unit with a stored program of controlling a switching network for a monitoring station comprising N monitor units, each unit having an individual input line for an analog signal to be monitored, each input line being also connected to the network, and the station having M instrumentation units for additional monitoring of the analog signals, with a channel from the network to each instrumentation unit, M and N being integers greater than one, each monitor unit having M manual switches, one for each of the M channels, with the network providing feedback indicating established connections for each channel;

said method comprising an overall routine with steps to initialize operation followed by channel routines for each of the M channels in sequence and back to the first channel routine in a loop which continues as long as power is on and operation is normal;

in which each channel routine comprises steps for reading switch inputs indicating the status of the manual switches for that channel, and to analyze the inputs to determine if any of the manual switches for that channel are operated; a decision responsive to no manual switch being operated to branch and proceed to the channel routine for the next channel, or responsive to at least one switch input indicating an operated manual switch to select only one, to clear previous output with a command to reset the network for that channel, to store the new output and cause signals to be supplied to operate the network to connect the corresponding input line to the channel and provide an indication that the particular connection has been established, followed by steps for reading the feedback status for the channel, and in response to feedback indicating that the requested connection has been made to proceed to the channel routine for the next channel;

the channel routines being independent so that an input line can be simultaneously connected via the network to any number of the M channels, but not more than one input line can be connected to each channel at a time;

wherein if more than one request is made a decision takes place, if one of the selected input lines is the same as the currently activated input, no action takes place, but if the selected input lines are different than what is currently activated, a precedence operation determines which is selected.

4. A method according to claim 3, wherein the N monitor units are organized in groups, and the steps of each channel routine are performed by addressing the groups via an address bus for the different operations and using data words for complete groups, with communication of the data for input and output via a data bus.

* * * * *